(12) United States Patent
Xie

(10) Patent No.: US 11,289,389 B2
(45) Date of Patent: Mar. 29, 2022

(54) DISPLAY DEVICE WITH IMPROVED CHIP CONTACT

(71) Applicant: WUHAN CHINA STAR OPTOELECTRONICS SEMICONDUCTOR DISPLAY TECHNOLOGY CO., LTD., Wuhan (CN)

(72) Inventor: Si Xie, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 196 days.

(21) Appl. No.: 16/462,157

(22) PCT Filed: Nov. 1, 2018

(86) PCT No.: PCT/CN2018/113305
§ 371 (c)(1),
(2) Date: May 17, 2019

(87) PCT Pub. No.: WO2020/029442
PCT Pub. Date: Feb. 13, 2020

(65) Prior Publication Data
US 2020/0273761 A1    Aug. 27, 2020

(30) Foreign Application Priority Data
Aug. 9, 2018 (CN) ............ 201810902738.5

(51) Int. Cl.
*H01L 23/02* (2006.01)
*H01L 23/13* (2006.01)
(Continued)

(52) U.S. Cl.
CPC ........ *H01L 23/13* (2013.01); *G02F 1/133345* (2013.01); *G09F 9/33* (2013.01)

(58) Field of Classification Search
CPC .............. H01L 23/13; G02F 1/133345; G02F 1/13458; G02F 1/1345; G09F 9/33; G09F 9/35
See application file for complete search history.

(56) References Cited

U.S. PATENT DOCUMENTS

2016/0211279 A1    7/2016   Her
2019/0004641 A1    1/2019   Huang et al.
(Continued)

FOREIGN PATENT DOCUMENTS

CN    106252361 A    12/2016
CN    106601776 A    4/2017
(Continued)

*Primary Examiner* — Ismail A Muse
(74) *Attorney, Agent, or Firm* — Osha Bergman Watanabe & Burton LLP

(57) ABSTRACT

A display panel is provided. The display panel includes a display component and a chip, wherein the display component includes at least one recess portion and a gate line layer, and the gate line layer is exposed on a bottom surface of the recess portion. The chip is connected to the display component, and at least one portion of the chip is embedded in the recess portion. The present disclosure can prevent a display component in the display panel from being in contact with a chip due to bending of the display panel.

19 Claims, 4 Drawing Sheets

(51) Int. Cl.
*G02F 1/1333* (2006.01)
*G09F 9/33* (2006.01)

(56) References Cited

U.S. PATENT DOCUMENTS

2019/0011756 A1   1/2019   Huang
2019/0206961 A1*  7/2019   Kim .................... H01L 27/3276

FOREIGN PATENT DOCUMENTS

| CN | 107144999 A | 9/2017 |
| CN | 107153307 A | 9/2017 |
| CN | 108231800 A | 6/2018 |

* cited by examiner

DISPLAY DEVICE WITH IMPROVED CHIP CONTACT

FIELD OF INVENTION

The present disclosure relates to a display technology filed, and in particular to a display panel.

BACKGROUND OF INVENTION

In prior art, when a display panel is bent, pins of a chip disposed on the display panel are easily separated or deformed from a display component of the display panel. At this time, the chip and the display component are in poor contact, which could reduce display effect of the display panel, and even shorten service life of the display panel.

As a result, it is necessary to provide a new technical solution to solve existing problems in conventional technologies as described above.

SUMMARY OF INVENTION

An object of the present disclosure is to provide a display panel, which can prevent a display component in the display panel from being in contact with a chip due to bending of the display panel.

The present disclosure provides a display panel, and the display panel comprises a display component and a chip. The display component includes a display area and a connection area located on at least one side of the display area, a portion of the display component corresponding to the connection area comprises at least one recess portion, the portion of the display component corresponding to the connection area comprises a gate line layer, and the gate line layer is exposed on a bottom surface of the recess portion. The chip is connected to the portion of the display component corresponding to the connection area, wherein at least one portion of the chip is embedded in the recess portion. The chip comprises a chip body and at least one connecting member, one end of the connecting member is connected to the chip body, and the other end of the connecting member is embedded in the recess portion. The portion of the display component corresponding to the connection area further comprises a flexible film layer, a buffer layer, a first gate insulating layer, a second gate insulating layer, and a planarization layer. The buffer layer is disposed on the flexible film layer. The first gate insulating layer is disposed on the buffer layer, wherein the gate line layer is disposed on the first gate insulating layer. The second gate insulating layer is disposed on the gate line layer and the first gate insulating layer. The planarization layer is disposed on the second gate insulation layer. An upper surface of the gate line layer is coplanar with a bottom surface of the recess portion. The upper surface of the gate line layer protrudes from the bottom surface of the recess portion.

In the abovementioned display panel, the recess portion is located on the gate line layer.

In the abovementioned display panel, the recess portion penetrates through the planarization layer, a bottom surface of the recess portion is located inside the second gate insulating layer, and the connecting member is in contact with a portion of the gate line layer exposed in the recess portion.

The present disclosure provides a display panel, and the display panel comprises a display component and a chip. The display component includes a display area and a connection area located on at least one side of the display area, wherein a portion of the display component corresponding to the connection area comprises at least one recess portion, the portion of the display component corresponding to the connection area comprises a gate line layer, and the gate line layer is exposed on a bottom surface of the recess portion. The chip is connected to the portion of the display component corresponding to the connection area, wherein at least one portion of the chip is embedded in the recess portion.

In the abovementioned display panel, the chip comprises a chip body and at least one connecting member, one end of the connecting member is connected to the chip body, and the other end of the connecting member is embedded in the recess portion.

In the abovementioned display panel, the portion of the display component corresponding to the connection area further comprises a flexible film layer, a buffer layer, a first gate insulating layer, a second gate insulating layer, and a planarization layer. The buffer layer is disposed on the flexible film layer. The first gate insulating layer is disposed on the buffer layer, wherein the gate line layer is disposed on the first gate insulating layer. The second gate insulating layer is disposed on the gate line layer and on the first gate insulating layer. The planarization layer is disposed on the second gate insulation layer.

In the abovementioned display panel, the recess portion is located on the gate line layer.

In the abovementioned display panel, the recess portion penetrates through the planarization layer, a bottom surface of the recess portion is located inside the second gate insulating layer, and the connecting member is in contact with a portion of the gate line layer exposed in the recess portion.

In the abovementioned display panel, conductive particles are disposed between the gate line layer and the connecting member.

In the abovementioned display panel, a surface of the portion of the gate line layer exposed in the recess portion is provided in a concave-convex shape.

In the abovementioned display panel, the portion of the display component corresponding to the connection area further comprises a concave-convex member provided on the buffer layer, wherein a position of the concave-convex member corresponds to a position of a portion of the gate line layer exposed in the recess portion, at least one portion of the first gate insulating layer is disposed on the concave-convex member, and at least one portion of the gate line layer is disposed on a portion of the first gate insulating layer corresponding to the concave-convex member.

In the abovementioned display panel, the concave-convex member includes tip portions and/or curved projections, and the tip portions and/or the curved projections face away from the flexible film layer.

In the abovementioned display panel, at least one portion of the first gate insulating layer and at least one portion of the gate line layer are disposed on the tip portion of the concave-convex member and in a groove between adjacent tip portions of the concave-convex member.

In the abovementioned display panel, an angle between two tip end faces of the tip portion is less than or equal to 90 degrees.

In the abovementioned display panel, a surface of the curved projection is an arc-shaped curved surface or an irregular curved surface, and the arc-shaped curved surface is a spherical surface or an ellipsoidal surface.

In the abovementioned display panel, a surface of the connecting member in contacting with the conductive particles is provided in a concave-convex shape.

In the abovementioned display panel, a side wall of the recess portion is provided with a first engaging portion, a side wall of the connecting member is provided with a second engaging portion, and the first engaging portion is engaged with the second engaging portion.

In the abovementioned display panel, the first engaging portion and the second engaging portion are configured to fix the connecting member and the display component to the recess portion to improve a stability of the connection between the display component and the chip when the display panel is bent.

In the abovementioned display panel, a conductive layer is disposed on a side wall of the recess portion, and the conductive layer extends to the bottom surface of the recess portion and connects to the gate line layer.

In the abovementioned display panel, the conductive layer is configured to keep an electrical connection between the connecting member and the gate line layer when the connecting member is separated from the gate line layer and still located in the recess portion.

In the present disclosure, the portion of the display component corresponding to the connection area comprises at least one recess portion, the gate line layer is exposed on the bottom surface of the recess portion, and at least one portion of the chip is embedded in the recess portion. Thus, the recess portion can increase the resistance of the display component to be separated from the chip when the display panel is bent, so that a stability of the connection between the display component and the chip is kept when the display panel is bent. Therefore, the present disclosure can prevent the display component in the display panel from being in contact with the chip due to bending of the display panel, and it is possible to avoid the occurrence of bright lines in the image displayed by the display panel.

In order to achieve the abovementioned description of the present disclosure can be best understood by referring to the following detailed description of the preferred embodiments and the accompanying drawings.

DETAILED DESCRIPTION OF PREFERRED EMBODIMENTS

The word "embodiment" is used herein to mean serving as an example, instance, or illustration. In addition, the articles "a" and "an" as used in this application and the appended claims may generally be construed to mean "one or more" unless specified otherwise or clear from context to be directed to a singular form.

Figure 1:
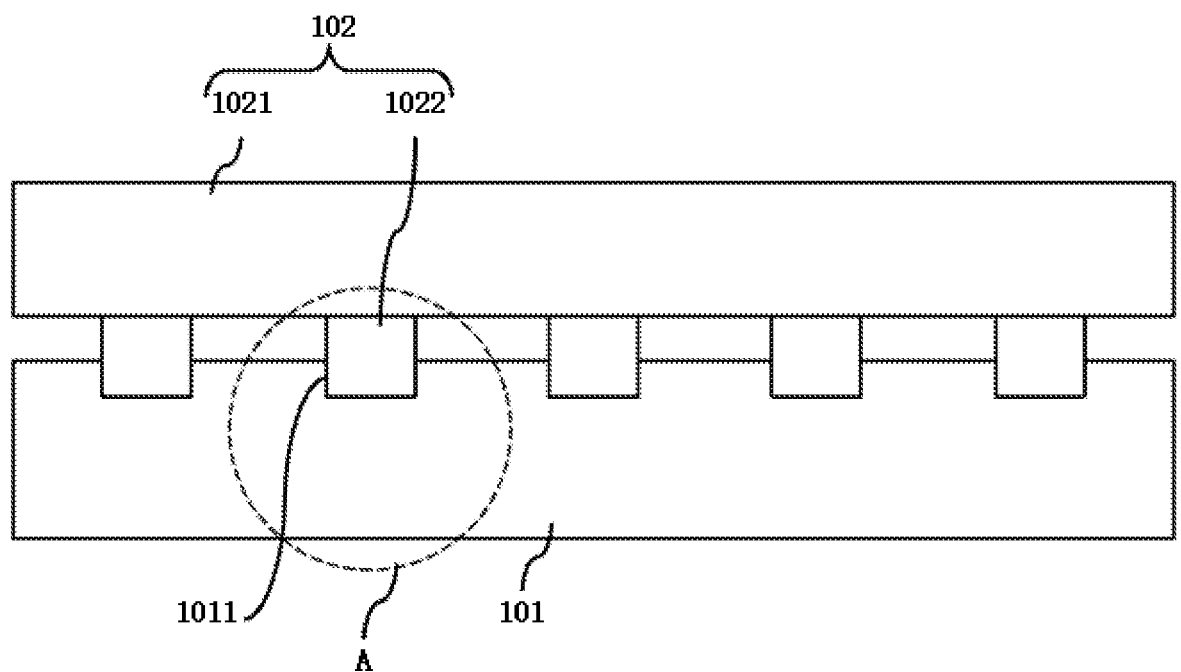
FIG. 1 is a schematic view of a display panel of the present disclosure.
Figure 2:
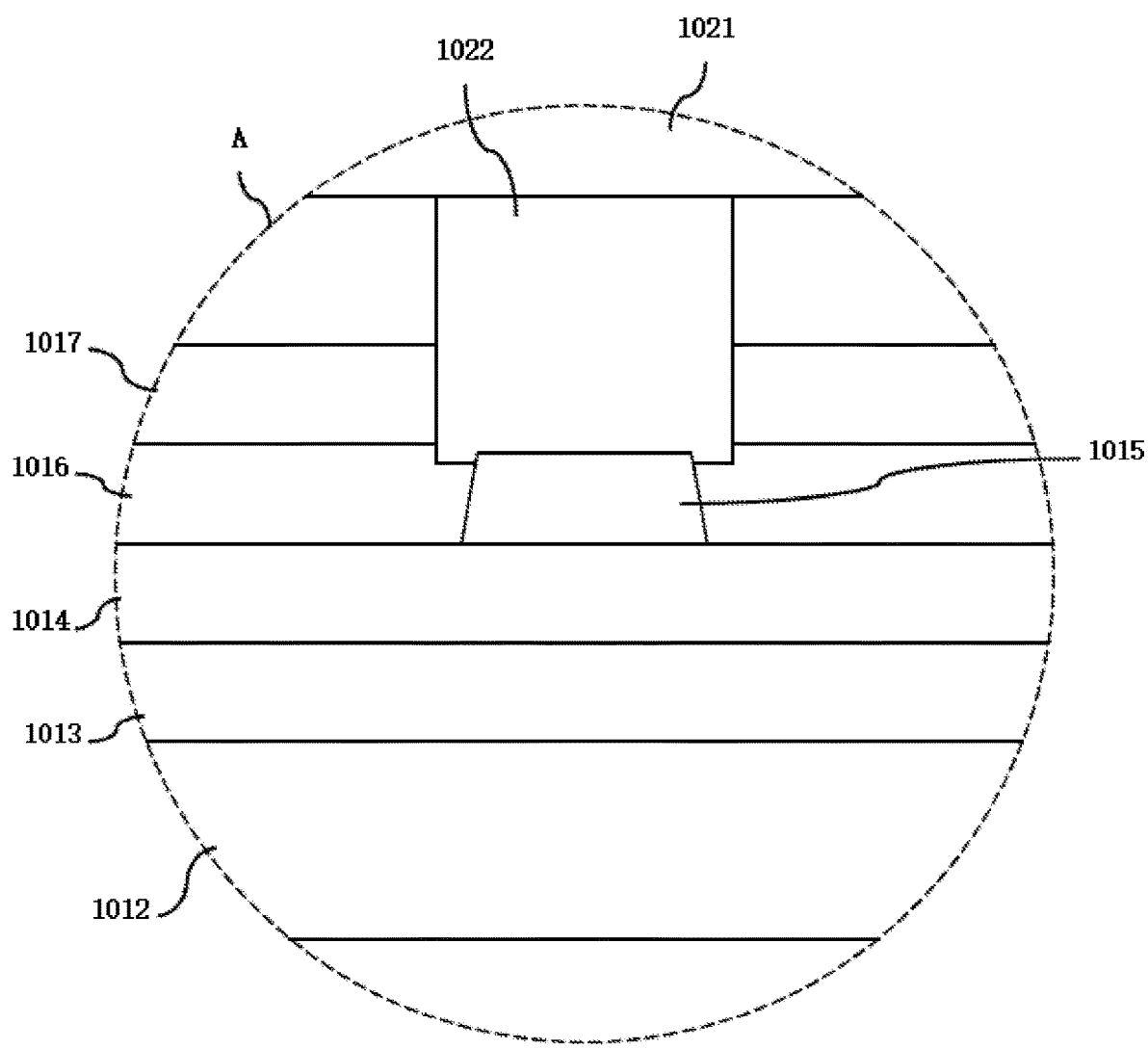
FIG. 2 is a partially enlarged schematic view located at a region A according to a first embodiment of the display panel shown in FIG. 1.

Referring to FIGS. 1-2, a schematic view of a display panel of the present disclosure and a partially enlarged schematic view located at a region A according to a first embodiment of the display panel shown in FIG. 1. are illustrated.

The display panel of the embodiment is suitable for a thin film transistor liquid crystal display (TFT-LCD), an organic light emitting diode (OLED), and the like.

The display panel of the embodiment comprises a display component 101 and a chip 102.

The display component 101 includes a display area and a connection area located on at least one side of the display area.

A portion of the display component 101 corresponding to the display area is configured to display images. A portion of the display component 101 corresponding to the connection area is configured to dispose the chip 102.

The portion of the display component 101 corresponding to the connection area comprises at least one recess portion 1011.

The chip 102 is connected to the portion of the display component 101 corresponding to the connection area, wherein at least one portion of the chip 102 is embedded in the recess portion 1011.

The recess portion 1011 is configured to increase resistance of the display component 101 to be separated from the chip 102 when the display panel is bent, so that stability of a connection between the display component 101 and the chip 102 is kept when the display panel is bent.

The chip 102 comprises a chip body 1021 and at least one connecting member 1022, wherein one end of the connecting member 1022 is connected to the chip body 1021, and the other end of the connecting member 1022 is embedded in the recess portion 1011.

The connecting member 1022 is configured to connect the chip body 1021 and the display component 101.

The material of the connecting member 1022 is a conductive metal.

The portion of the display component 101 corresponding to the connection area further comprises a flexible film layer 1012, a buffer layer 1013, a first gate insulating layer 1014, a gate line layer 1015, a second gate insulating layer 1016, and a planarization layer 1017.

The buffer layer 1013 is disposed on the flexible film layer 1012. The first gate insulating layer 1014 is disposed on the buffer layer 1013, wherein the gate line layer 1015 is disposed on the first gate insulating layer 1014. The second gate insulating layer 1016 is disposed on the gate line layer 1015 and the first gate insulating layer 1014. The planarization layer 1017 is disposed on the second gate insulation layer 1016.

A position of the recess portion 1011 located on the display component 101 corresponds to a position of the gate line layer 1015 located on the display component 101. Namely, the recess portion 1011 is located on the gate line layer 1015.

The recess portion 1011 penetrates through the planarization layer 1017, a bottom surface of the recess portion 1011 is located inside the second gate insulating layer 1016, the gate line layer 1015 is exposed on the bottom surface of the recess portion 1011, and the connecting member 1022 is in contact with a portion of the gate line layer 1015 exposed in the recess portion 1011 (electrical connection). There are two situations including the gate line layer 1015 exposed in the recess portion 1011: (1) an upper surface of the gate line layer 1015 (the gate line layer 1015 facing away from a surface of the flexible film 1012) is coplanar with a bottom surface of the recess portion 1011; (2) the upper surface of the gate line layer 1015 protrudes from the bottom surface of the recess portion 1011. In a direction perpendicular to a plane corresponding to the display panel, the upper surface of the gate line layer 1015 is located between an opening portion of the recess portion 1011 and the bottom surface of the recess portion 1011. Namely, the upper surface of the gate line layer 1015 is located inside the recess portion 1011.

As a modification, a side wall of the recess portion 1011 is provided with a first engaging portion, a side wall of the connecting member 1022 is provided with a second engaging portion, and the first engaging portion is engaged with the second engaging portion.

The first engaging portion and the second engaging portion are configured to fix the connecting member 1022 and the display component 101 to the recess portion 1011 to improve stability of the connection between the display component 101 and the chip 102 when the display panel is bent. Namely, the first engaging portion and the second engaging portion are configured to prevent the chip 102 from separating from the display component 101 when the display component 101 is bent.

As a modification, a conductive layer is disposed on a side wall of the recess portion 1011, and the conductive layer extends to the bottom surface of the recess portion 1011 and connects to the gate line layer 1015.

The conductive layer is configured to keep an electrical connection between the connecting member 1022 and the gate line layer 1015 when the connecting member 1022 is separated from the gate line layer 1015 and still located in the recess portion 1011.

Figure 3:
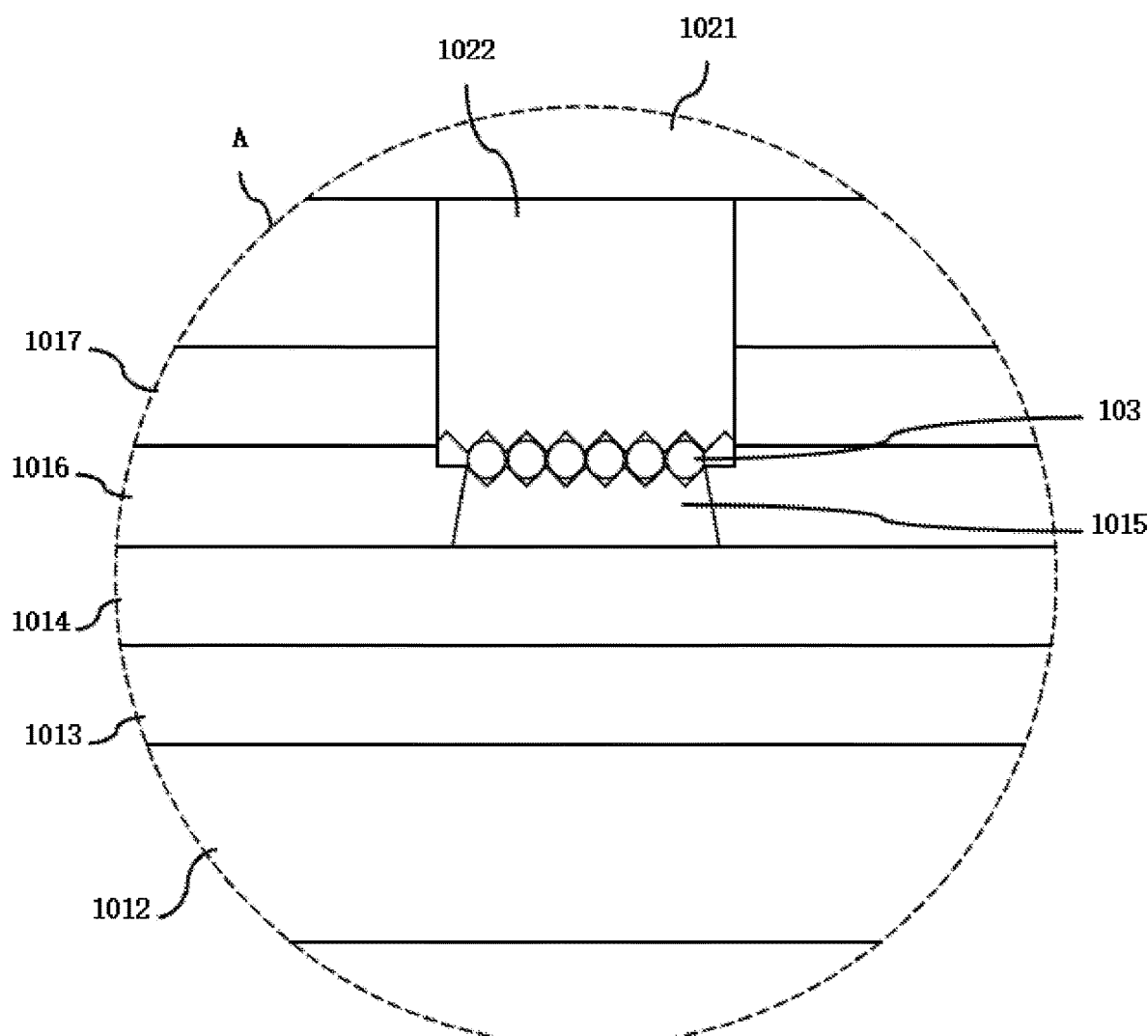
FIG. 3 is a partially enlarged schematic view located at a region A according to a second embodiment of the display panel shown in FIG. 1.
Figure 4:
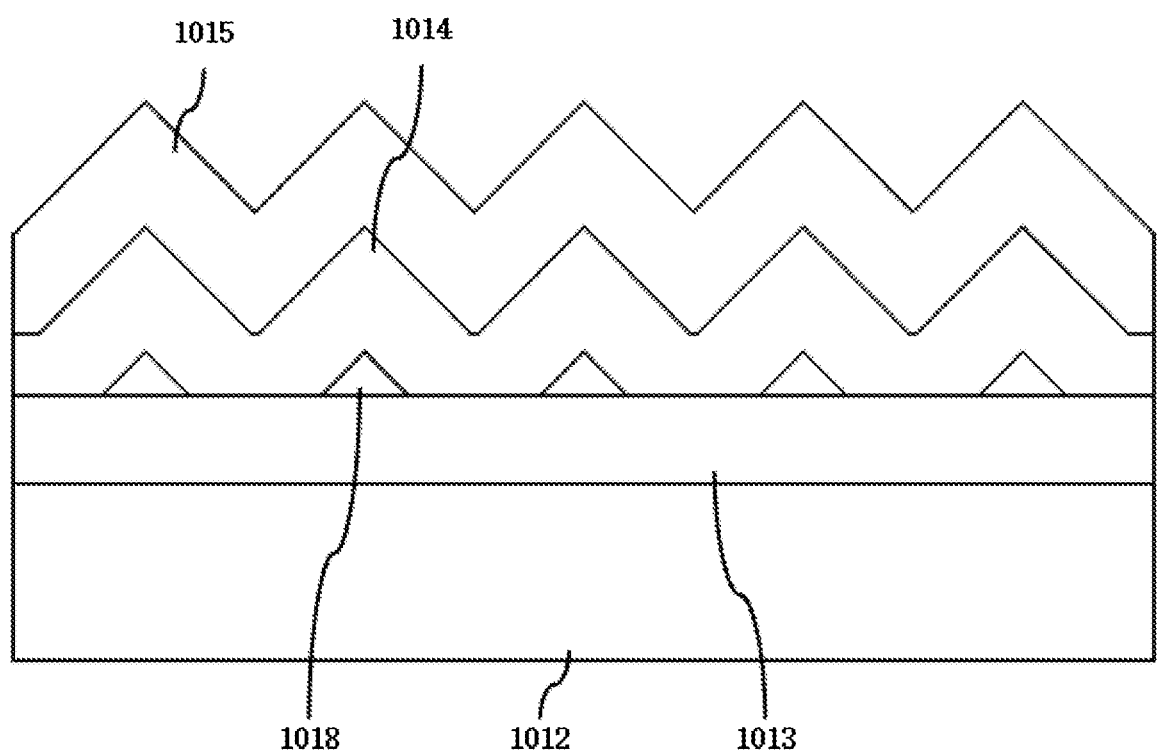
FIG. 4 is a schematic view of a portion of the display panel shown in FIG. 3 corresponding to a recess portion.

Referring to FIGS. 3-4, a partially enlarged schematic view located at a region A according to a second embodiment of the display panel shown in FIG. 1 and a schematic view of a portion of the display component 101 of the display panel shown in FIG. 3 corresponding to a recess portion 1011 are illustrated.

The embodiment is similar to the first embodiment described above, the difference is: conductive particles 103 are disposed between the gate line layer 1015 and the connecting member 1022; a surface of the portion of the gate line layer 1015 exposed in the recess portion 1011 is provided in a concave-convex shape.

The concave-convex shape of the gate line layer 1015 is configured to increase a contact area between the gate line layer 1015 and the conductive particles 103, so that the stability of the connection of the display component 101 and the chip 102 is improved when the display panel is bent.

The portion of the display component 101 corresponding to the connection area further comprises a concave-convex member 1018.

The concave-convex member 1018 is provided on the buffer layer 1013 or the flexible film layer 1012, wherein a position of the concave-convex member 1018 corresponds to a position of a portion of the gate line layer 1015 exposed in the recess portion 1011, at least one portion of the first gate insulating layer 1014 is disposed on the concave-convex member 1018, and at least one portion of the gate line layer 1015 is disposed on a portion of the first gate insulating layer 1014 corresponding to the concave-convex member 1018. The concave-convex member 1018 is configured to form a portion of the gate line layer 1015 corresponding to the concave-convex member 1018 to be a concave-convex shape.

The concave-convex member 1018 is provided on the buffer layer 1013 or the flexible film layer 1012, the concave-convex member 1018 includes tip portions and/or curved projections, and the tip portions and/or the curved projections face away from the flexible film layer 1012. A surface of the curved projection is an arc-shaped curved surface or an irregular curved surface, and the arc-shaped curved surface is a spherical surface or an ellipsoidal surface.

At least one portion of the first gate insulating layer 1014 and at least one portion of the gate line layer 1015 are disposed on the tip portion of the concave-convex member 1018 and in a groove between adjacent tip portions of the concave-convex member 1018.

An angle between two tip end faces of the tip portion is less than or equal to 90 degrees. Preferably, the angle is less than or equal to 60 degrees.

When the concave-convex member 1018 is disposed on the buffer layer 1013, the material of the concave-convex member 1018 is a semiconductor material (active layer material). In the process of disposing a semiconductor member (active layer) in the display area of the display component 101, the concave-convex member 1018 is formed by disposing a semiconductor material (active layer material) in the connection area and by performing a mask process or an etching process on the semiconductor material (active layer material) provided in the connection area.

When the concave-convex member 1018 is disposed on the flexible film layer 1012, the material of the concave-convex member 1018 is the same as the material of the flexible film layer 1012. In the process of forming the flexible film layer 1012, the concave-convex member 1018 is formed by providing a concave-convex shape on a surface of the portion of the flexible film layer 1012 corresponding to the gate line layer 1015. The portion of the flexible film layer 1012 provided in a concave-convex shape is the concave-convex member 1018.

A surface of the connecting member 1022 in contacting with the conductive particles 103 is provided in a concave-convex shape.

A surface of the concave-convex shape of the connecting member 1022 and a surface of the concave-convex shape of the gate line layer 1015 are configured to engage the conductive particles 103.

In the present disclosure, the portion of the display component 101 corresponding to the connection area comprises at least one recess portion 1011, the gate line layer 1015 is exposed on the bottom surface of the recess portion 1011, and at least one portion of the chip 102 is embedded in the recess portion 1011. Thus, the recess portion 1011 can increase the resistance of the display component 101 to be separated from the chip 102 when the display panel is bent, so that the stability of the connection between the display component 101 and the chip 102 is kept when the display panel is bent. Therefore, the present disclosure can prevent the display component 101 in the display panel from being in contact with the chip 102 due to bending of the display panel, and it is possible to avoid the occurrence of bright lines in the images displayed by the display panel.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A display panel, comprising:
a display component including a display area and a connection area located on at least one side of the display area, wherein a portion of the display component corresponding to the connection area comprises at least one recess portion, the portion of the display component corresponding to the connection area comprises a gate line layer, and the gate line layer is exposed on a bottom surface of the recess portion; and a chip connected to the portion of the display component corresponding to the connection area, wherein at least one portion of the chip is embedded in the recess portion;

wherein the chip comprises a chip body and at least one connecting member, one end of the connecting member is connected to the chip body, and the other end of the connecting member is embedded in the recess portion;

wherein the portion of the display component corresponding to the connection area further comprises:

a flexible film layer;

a buffer layer disposed on the flexible film layer;

a first gate insulating layer disposed on the buffer layer, wherein the gate line layer is disposed on the first gate insulating layer;

a second gate insulating layer disposed on the gate line layer and the first gate insulating layer; and a planarization layer disposed on the second gate insulation layer;

wherein an upper surface of the gate line layer is coplanar with a bottom surface of the recess portion;

wherein the upper surface of the gate line layer protrudes from the bottom surface of the recess portion.

2. The display panel according to claim 1, wherein the recess portion is located on the gate line layer.

3. The display panel according to claim 1, wherein the recess portion penetrates through the planarization layer, a bottom surface of the recess portion is located inside the second gate insulating layer, and the connecting member is in contact with a portion of the gate line layer exposed in the recess portion.

4. A display panel, comprising:

a display component including a display area and a connection area located on at least one side of the display area, wherein a portion of the display component corresponding to the connection area comprises at least one recess portion, the portion of the display component corresponding to the connection area comprises a gate line layer, and the gate line layer is exposed on a bottom surface of the recess portion, wherein the portion of the display component corresponding to the connection area further comprises a flexible film layer, a buffer layer disposed on the flexible film layer, a first gate insulating layer disposed on the buffer layer, wherein the gate line layer is disposed on the first gate insulating layer, a second gate insulating layer disposed on the gate line layer and on the first gate insulating layer, and a planarization layer disposed on the second gate insulation layer; and a chip connected to the portion of the display component corresponding to the connection area, wherein at least one portion of the chip is embedded in the recess portion.

5. The display panel according to claim 4, wherein the chip comprises a chip body and at least one connecting member, one end of the connecting member is connected to the chip body, and the other end of the connecting member is embedded in the recess portion.

6. The display panel according to claim 5, wherein conductive particles are disposed between the gate line layer and the connecting member.

7. The display panel according to claim 6, wherein a surface of the portion of the gate line layer exposed in the recess portion is provided in a concave-convex shape.

8. The display panel according to claim 7, wherein the portion of the display component corresponding to the connection area further comprises:

a concave-convex member provided on the buffer layer, wherein a position of the concave-convex member corresponds to a position of a portion of the gate line layer exposed in the recess portion, at least one portion of the first gate insulating layer is disposed on the concave-convex member, and at least one portion of the gate line layer is disposed on a portion of the first gate insulating layer corresponding to the concave-convex member.

9. The display panel according to claim 8, wherein the concave-convex member includes tip portions and/or curved projections, and the tip portions and/or the curved projections face away from the flexible film layer.

10. The display panel according to claim 9, wherein at least one portion of the first gate insulating layer and at least one portion of the gate line layer are disposed on the tip portion of the concave-convex member and in a groove between adjacent tip portions of the concave-convex member.

11. The display panel according to claim 9, wherein an angle between two tip end faces of the tip portion is less than or equal to 90 degrees.

12. The display panel according to claim 9, wherein a surface of the curved projection is an arc-shaped curved surface or an irregular curved surface, and the arc-shaped curved surface is a spherical surface or an ellipsoidal surface.

13. The display panel according to claim 6, wherein a surface of the connecting member in contacting with the conductive particles is provided in a concave-convex shape.

14. The display panel according to claim 5, wherein a side wall of the recess portion is provided with a first engaging portion, a side wall of the connecting member is provided with a second engaging portion, and the first engaging portion is engaged with the second engaging portion.

15. The display panel according to claim 14, wherein the first engaging portion and the second engaging portion are configured to fix the connecting member and the display component to the recess portion to improve stability of the connection between the display component and the chip when the display panel is bent.

16. The display panel according to claim 5, wherein a conductive layer is disposed on a side wall of the recess portion, and the conductive layer extends to the bottom surface of the recess portion and connects to the gate line layer.

17. The display panel according to claim 16, wherein the conductive layer is configured to keep an electrical connection between the connecting member and the gate line layer when the connecting member is separated from the gate line layer and still located in the recess portion.

18. The display panel according to claim 4, wherein the recess portion is located on the gate line layer.

19. The display panel according to claim 4, wherein the recess portion penetrates through the planarization layer, a bottom surface of the recess portion is located inside the second gate insulating layer, and the connecting member is in contact with a portion of the gate line layer exposed in the recess portion.

* * * * *